(12) United States Patent
Foster et al.

(10) Patent No.: US 7,592,817 B2
(45) Date of Patent: Sep. 22, 2009

(54) ALIGNMENT CORRECTION SYSTEM AND METHOD OF USE

(75) Inventors: Robert J. Foster, Brooklyn, NY (US); Lin Zhou, LaGrangeville, NY (US); Shahin Zangooie, Hopewell Junction, NY (US); Roger M. Young, Warwick, NY (US); Clemente Bottini, Marlboro, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 11/778,679

(22) Filed: Jul. 17, 2007

(65) Prior Publication Data

US 2009/0021236 A1     Jan. 22, 2009

(51) Int. Cl.
*G01R 31/08* (2006.01)
*G01R 31/02* (2006.01)
*G01R 31/26* (2006.01)

(52) U.S. Cl. ............... 324/525; 324/758; 324/765
(58) Field of Classification Search ............ 324/758, 324/765, 525
See application file for complete search history.

(56) References Cited

U.S. PATENT DOCUMENTS

| 4,457,664 | A  | * | 7/1984  | Judell et al. ............ 414/779 |
| 5,551,829 | A  |   | 9/1996  | Jerolimov et al. |
| 5,759,007 | A  |   | 6/1998  | Nichols et al. |
| 6,324,298 | B1 |   | 11/2001 | O'Dell et al. |
| 6,456,378 | B2 |   | 9/2002  | David |
| 7,123,362 | B2 |   | 10/2006 | Ban |
| 7,388,385 | B1 | * | 6/2008  | Iacob ............... 324/691 |
| 7,494,830 | B2 | * | 2/2009  | Liu et al. ............ 438/16 |
| 2005/0213085 | A1 | * | 9/2005 | Lee et al. ............ 356/237.2 |

* cited by examiner

*Primary Examiner*—Amy He
(74) *Attorney, Agent, or Firm*—Margaret Pepper; Greenblum & Bernstein P.L.C.

(57) ABSTRACT

A system and method for correcting alignment of a product on a tool and, more particularly, to a system and method for correcting alignment of a wafer on a chuck of a tool. The system is a tool comprising at least one contact near a circumference of the tool and a grounded contact proximate to the at least one contact. The method comprises measuring current on each branch of a circuit and calculating an angle of a wafer based on a difference in the current on each branch of the circuit.

2 Claims, 9 Drawing Sheets

If the contact is exactly centered, $I_1 = I_2$. (Assuming $V_1 = V_2$)

The angle θ is derived from the difference in the resistances (and therefore currents) on each side of the connection.

ALIGNMENT CORRECTION SYSTEM AND METHOD OF USE

FIELD OF THE INVENTION

The invention generally relates to a system and method for correcting alignment of a product on a tool and, more particularly, to a system and method for correcting alignment of a wafer on a chuck of a tool.

BACKGROUND OF THE INVENTION

Throughout the process of transforming a silicon wafer to a functional microelectronic device, there are several stages of processing that must occur. Each stage requires a specialized tool, which may require that the wafer be precisely aligned on its chuck for optimal performance.

By way of example, a complicated process using a plurality of superimposed photo-exposure masks is used to fabricate a highly integrated semiconductor device (IC). Particularly, the process includes using photo-exposure masks for each processing step. To use the photo-exposure masks, it is necessary to align such masks using a specifically shaped mark. This type of mark is called an alignment mark, i.e., a superimposition mark or an alignment key, which is essential for an overlap process. However, using known processes, it is becoming ever more difficult to properly align the wafer at each stage of the process, thus contributing to lower yields.

Moreover, as higher alignment precision is required for the manufacture of ICs in order to produce ever shrinking line widths while providing greater degree of functional integration, the difficulties to accurately and clearly detect and measure the positions of the alignment marks on a wafer often become a limitation to further miniaturize the IC devices. The difficulties arise from the fact that the alignment marks on a wafer employed for relative position measurements are often smeared or stained as the results of various manufacturing processes. And, as the alignment marks become blurred, an alignment measurement may not be accurately performed.

For example, as a CMP process is provided during the fabrication process, the fine line definition of the alignment marks may be lost and no longer suitable for the purpose of high precision alignment. Additionally, in the process of forming various circuit elements, various layers are formed over the top surface and then patterned, also causing the alignment marks to become blurred and unclear.

Accordingly, there exists a need in the art to overcome the deficiencies and limitations described hereinabove.

SUMMARY OF THE INVENTION

In a first aspect of the invention, a tool comprises at least one contact near a circumference of the tool and a grounded contact proximate to the at least one contact.

In embodiments, the tool further comprises at least one spring on an underside of the contact to provide an upward biasing force. The at least one contact is coupled to ammeters via low resistance connecting wires. The low resistance connecting wires are comprised of one of silver, copper, aluminum, gold and platinum. The at least one contact is at least one arc shaped contact. The contact and grounded contact form a closed circuit when a contact on a back of the wafer bridges a gap therebetween.

In further embodiments, an independently moveable inner cylinder or plate is provided on the tool. The independently moveable inner cylinder or plate is configured to lift, rotate and lower a wafer to adjust an alignment angle of the wafer. The independently moveable inner cylinder or plate is controllable by a control. The at least one contact is made of one of Manganin, copper, platinum and aluminum. A wafer "W" has at least one conducting contact. The at least one conducting contact is placed at 0° on the wafer and is configured to form a closed circuit when bridging a gap between the contact and grounded contact. The at least one conducting contact is three or four conducting contacts which are symmetrically disposed on a backside of the wafer.

In further embodiments, a computing infrastructure has executable code configured to calculate an angle of displacement of a wafer based on measured resistances of opposing branches of the contact from a point of electrical contact with the wafer. The at least one contact is at least two contacts and the tool further comprises a computing infrastructure having executable code configured to calculate a centering alignment of a wafer on the tool based on a triangulation of contacts on the backside of the wafer and two of the contacts.

In another aspect of the invention, the tool comprises at least one arc shaped contact about a portion of a circumference of the tool. A grounded contact is proximate to the at least one arc shaped contact. Ammeters are coupled to opposing sides of the arc shaped contact via low resistance connecting wires. A control is configured to perform angular alignment calculations of a wafer on the tool based on differences in measured current or resistance of the arc shaped contact as measured by the ammeters.

In another aspect of the invention, a computer program product comprises a computer usable medium having readable program code embodied in the medium. The computer program product includes at least one component to perform the processes of calculating an angle of displacement of a wafer based on measured resistance of opposing branches of a contact from a point of electrical contact with the wafer.

In another aspect of the invention, a method comprises measuring current on each branch of a circuit and calculating an angle of a wafer based on a difference in the current on each branch of the circuit.

DETAILED DESCRIPTION OF THE INVENTION

The invention generally relates to a system and method for aligning a product on a tool and, more particularly, to a system and method for correcting an alignment of a semiconductor wafer on a chuck of a tool. In more specific embodiments, the invention provides wafer alignment correction using an electric contact between the wafer and the chuck of the tool. To provide such alignment correction, the system and method incorporates a metal contact on a chuck and a back side of a wafer. By measuring the electrical current (or an associated resistance) of each branch of the contact to a contact point with the wafer, it is possible to determine wafer alignment and, if not aligned properly, accurately and precisely align the wafer on the chuck.

Exemplary Systems of Invention

Figure 1:
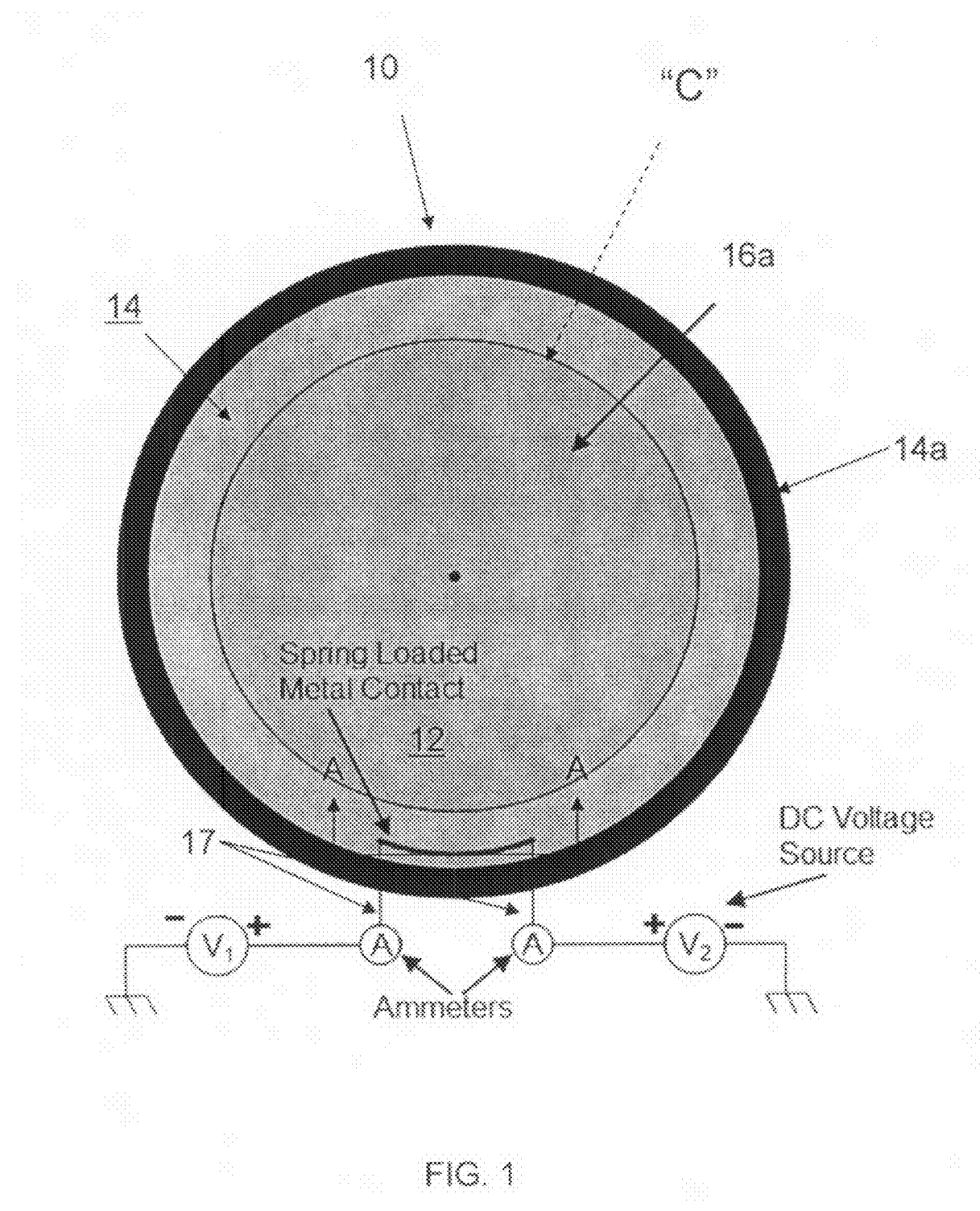
FIG. 1 shows an alignment system in accordance with the invention.

FIG. 1 shows an alignment tool in accordance with the invention. The alignment tool is generally depicted as reference numeral 10 and includes at least one conductive contact 12. In embodiments, two or more conductive contacts are also contemplated by the invention. For example, two conductive contacts can be used to provide wafer placement offset data, as discussed herein. As should be understood, wafer placement offset refers to the centering of the wafer on the chuck (compared to angular alignment).

In embodiments, the conductive contact 12 is arced shaped and is positioned near an edge of a wafer tool (e.g., chuck) 14. The metal contact 12 on the chuck preferably has a radius of curvature equal to or substantially equal to a wafer which is placed near an edge of the chuck and more specifically near an edge of the wafer when it is placed on the chuck.

In embodiments, the cross sectional area of the arc of the contact 12 should be as small as possible, preferably approximately $A=1000 \mu m^2$. As should be understood by those of skill in the art, a small area increases the electrical resistance of the contact and therefore increases its sensitivity per unit current. The radius of the arc of the contact 12 is preferably about 145 mm; although other radii are also contemplated by the present invention. It has been mathematically demonstrated, though, that using the largest radius possible provides the greatest amount of control over the angle. For example, in the case of 300 mm diameter wafers, a radius of 145 mm allows 5 mm of space between the contact 12 and the edge of the wafer.

In further embodiments, the conductive contact 12 is spring loaded to provide a slight pressure against the weight of a wafer, and therefore establish an electrically sound connection between the contact 12 and a conductive contact on a back of the wafer. (See, in FIG. 3.) The spring loading also allows the system to function more accurately in cases where the wafer would not otherwise make sound electrical contact with the contacts 12, e.g., the wafer is bowed.

The chuck 14 has a well-grounded plate 14a of conductive material (e.g., metal) about the circumference thereof. The contact 12 and well-grounded metal plate 14a form a closed circuit when a contact on a back of the wafer bridges the gap between the contact 12 and the well-grounded metal plate 14a. By forming a closed circuit, the system and method can calculate an angular displacement (e.g., alignment) of the wafer with respect to a center of the contact 12 using a difference in measured resistance (as a function of current) for each branch of the contact 12 (e.g., opposing sides of the contact with respect to the placement of the conductive contact 18a thereon). If there is no difference in the measured currents and hence resistances, alignment is proper.

An inner cylinder or plate 16 can be provided on the chuck 14. In embodiments, the inner cylinder or plate 16 is independently moveable with respect to the chuck 14. This independent movement includes lifting and lowering (using, e.g., a jack-type or gear mechanism) and rotation (using, e.g., a belt and gear system, rack and pinion type system and the like), all of which are shown schematically at reference numeral 16a.

By using the moveable inner cylinder or plate 16, a wafer (not shown) placed on the inner cylinder or plate 16 can be independently moved with respect to the chuck 14. This allows the wafer to be aligned without removing it from the chuck 14. An advantage of using the inner cylinder or plate 16 is that the rotation angle of the wafer can be changed without sliding the wafer on the contact 12. Thus, should the angle of the wafer need to be adjusted, the inner cylinder or plate 16 can be lifted, rotated, and then lowered to place the wafer on the contact 12, significantly eliminating the wear on the contact 12 and providing a method of reestablishing the contact if it is broken for any reason. In embodiments, the alignment (movement of the inner cylinder or plate 16) can be provided automatically via instructions from a controller "C".

In embodiments, the contact 12 is made of material with high resistivity and a low temperature coefficient. As should be understood by those of skill in the art, the higher the resistivity of the material will result in a more sensitive measurement. Also, a low temperature coefficient results in the system retaining its sensitivity at higher temperatures. By way of non-limiting example, the material for the contact 12 is preferably Manganin; although other materials are contemplated by the invention such as, for example, copper, platinum or aluminum. Manganin is an alloy of copper, manganese and nickel that provides an excellent combination of resistivity and temperature coefficient, as well as exceptional long term stability which ensures that the measurements are repeatable over the life of the tool.

The electrical resistivity of the contact 12 is preferably about $4.82 \times 10^{-7}$ [$\Omega$-m] at 20° C. (The higher the resistivity will allow more tolerances in the measurements.) The temperature coefficient of the contact 12 is preferably about $2 \times 10^{-6}$ [1/K], where the lower the temperature coefficient results in more temperature insensitive resistance measurements. It should be understood by those of skill in the art that the invention would work with other electrical resistivities and temperature coefficients as discussed below.

As further shown in FIG. 1, the contact 12 includes two identical ammeters "A" connected thereto via a low resistance wire (connecting wires) 17. In embodiments, the low resistance wires 17 may be comprised of, for example, silver, copper, aluminum, gold or platinum. Two independent DC voltage sources are coupled to each of the ammeters "A". The DC voltage sources provide voltages used for generating current across the connecting wires 17 and hence branches of the contact 12. In embodiments, the DC voltage may be as little as 0.1 V. The low voltage provides higher sensitivity to the current as the angle of alignment θ of the wafer is proportional to the voltages, as discussed in more detail below.

In further embodiments, the material used in the connecting wires 17 and grounding plate 14a is preferably silver, for example. Silver has a known low resistivity which allows the impact of the circuit approximation (as described below) to be as minimal as possible. In embodiments, the connecting wires 17 and grounding plate 14a have an electrical resistivity of about $1.59 \times 10^{-8}$ $\Omega$-m at 20° C. The temperature coefficient of the connecting wires 17 and grounding plate 14a may be about $3.8 \times 10^{-3}$; although other values are also contemplated by the invention.

Figure 2:
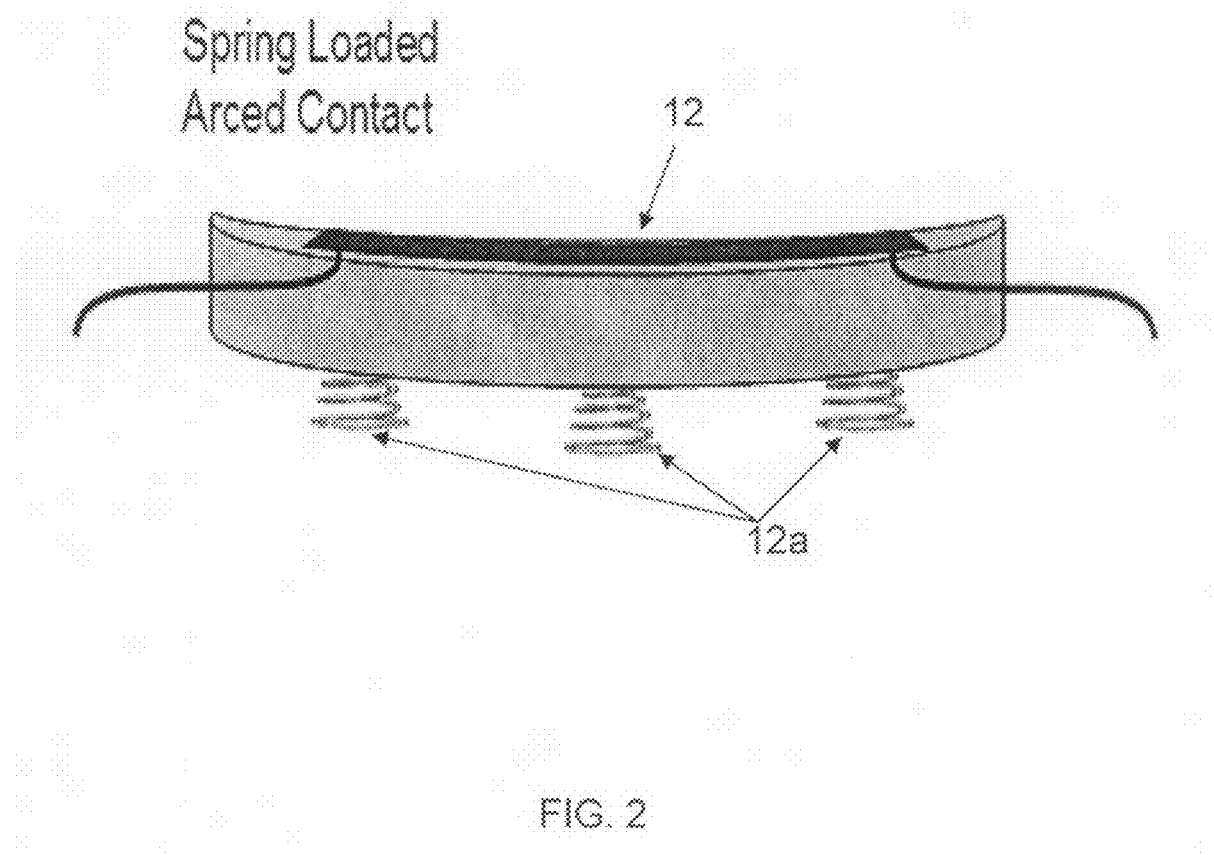
FIG. 2 shows a cross section of the alignment tool of FIG. 1 along line A-A.

FIG. 2 shows a cross-section of the alignment tool of FIG. 1, along line A-A. More specifically, FIG. 2 shows the contact 12 being spring loaded, via spring 12a. The spring-loaded contact 12 provides slight pressure against the weight of the wafer, and therefore establishes a more electrically sound connection between the wafer and the contact 12. The spring-loaded contact 12 also allows the system to function when the wafer "W" to be aligned is bowed or would not otherwise make contact with the contact 12.

Figure 3:
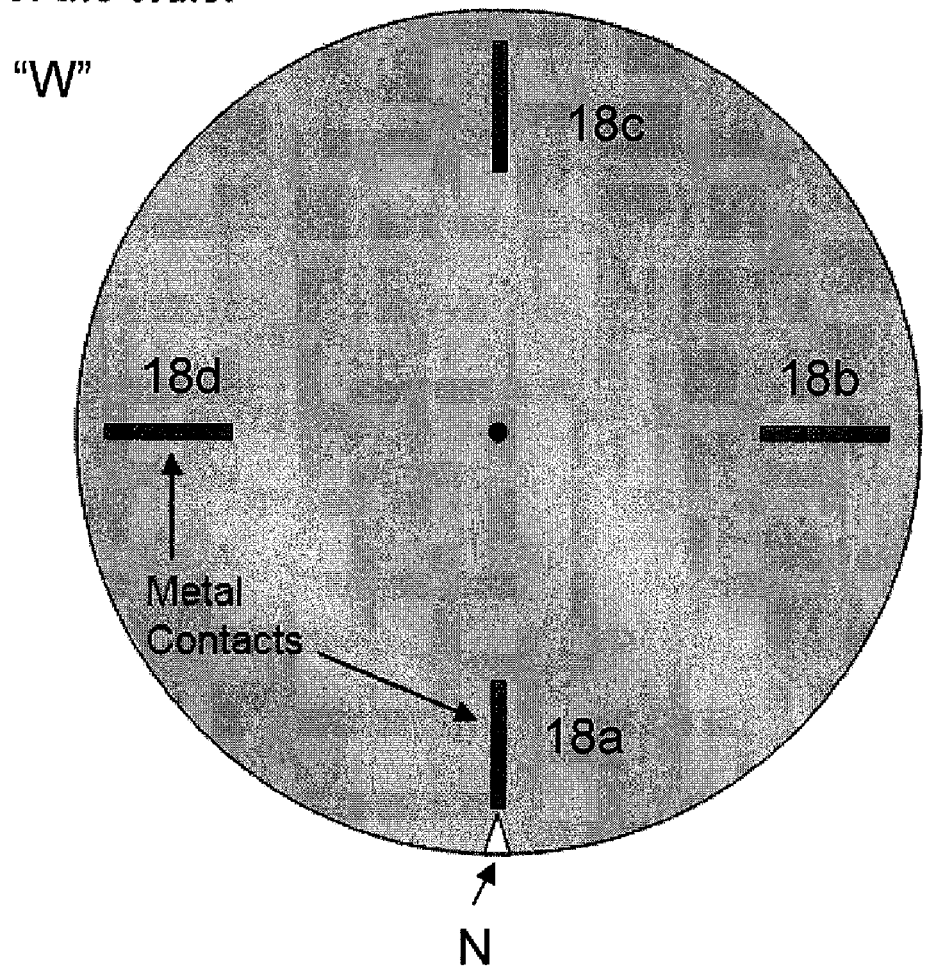
FIG. 3 shows a back side of a wafer.

FIG. 3 shows a back of a wafer "W". The back of the wafer "W" is printed with at least one conducting contact 18a-18d. In embodiments, two or more and preferably up to four conducting contacts can be provided on the back of the wafer "W". Adding a second conducting contact 18b perpendicular to the first conducting contact 18a provides wafer placement offset data, e.g., offset measurements from a center of the chuck. In order to provide the wafer placement offset data, a second conducting contact is also placed on the chuck 14 to provide the necessary triangulation data.

The offset data can be calculated by triangulating the center of the wafer with the alignment results of each conducting contact. More specifically, the system and method of the invention determines that the wafer is properly centered when both the first and second conducting contacts 18a, 18b (which are at right angles to one another) provide the same angle measurement using the processes herein.

The conducting contact 18a is designated by a notch "N" or other insignia on the wafer "W". This designation allows the user to readily identify which conductive contact 18a should be placed on the contact 12 of the chuck 14. The conducting contact 18a is preferably placed at 0° on the wafer; although other placements are also contemplated by the invention depending on where alignment of the wafer should occur. it should be understood that the notch is not required for operation, and is provided as an illustrative embodiment. Also, the notch may be provided by the manufacturer, as an industry standard.

Referring still to FIG. 3, the two other conducting contacts 18c and 18d can provide symmetry of design. Thus, in the case where a wafer must be spun, the use of four conducting contacts 18a-18d balances the weight distribution, eliminating any oscillations. If appropriately placed at 120° increments, three conducting contacts can also provide the symmetry of design. The symmetry also allows the wafer alignment to be measured in different orientations (e.g., preferably four orientations of 0°, 90°, 180°, 270° using four conducting contacts).

In embodiments, the conducting contact(s) can be made of any conducting material with a high resistivity, such as metals, a highly implanted/doped region, etc. In the case of an implanted/doped region, the surrounding intrinsic silicon can provide natural isolation from the wafer "W". Manganin may also be used for the conductive contacts, with the characteristics described above.

Figure 4A:
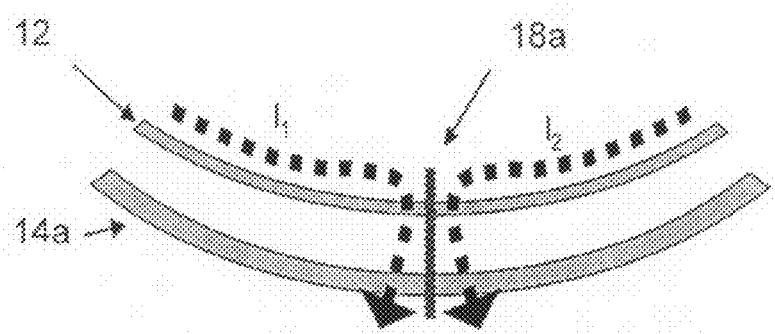
FIGS. 4A and 4B are representative of an alignment of the wafer with respect to a chuck in accordance with the invention.
Figure 4B:
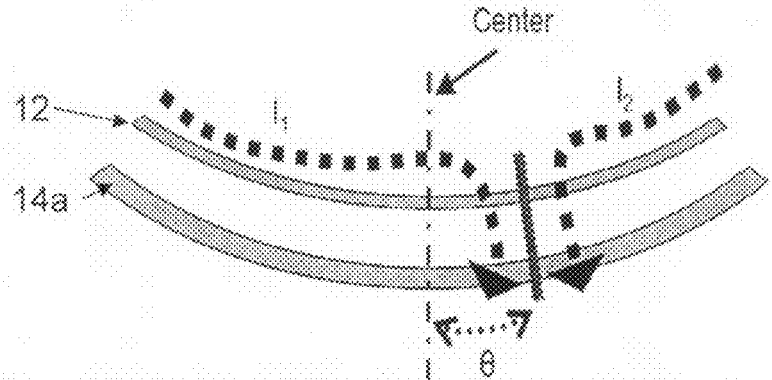

FIGS. 4A and 4B are representative of an alignment of the wafer with respect to a chuck. In operation, the conducting contact (18a) on the back of the wafer "W" bridges the contact 12 and the grounded plate 14a on the edge of the chuck 14. This connection draws current from each branch of the circuit, e.g., $I_1$ and $I_2$, which is then measured and recorded by the corresponding ammeters "A". In embodiments, the alignment calculation is made based on the differences in electrical resistance, e.g., differences in measured currents, $I_1$ and $I_2$, experienced on each side of the connection, e.g., electrical contact point between the contact 12 and the conducting contact 18a of the wafer "W". The value of this resistance is determined through Ohm's Law (as described in more detail below) since the voltage is known and the current can be measured.

As shown, in FIG. 4A, assuming that the voltages $V_1$ and $V_2$ are equal and the conductive contact 18a is centered on the contact 12, the current $I_1$ and $I_2$ will be equal. Accordingly, FIG. 4A represents a correctly aligned wafer, i.e., 0° angle. FIG. 4B, on the other hand, represents the wafer being misaligned on the chuck. In this situation, the currents $I_1$ and $I_2$ are not equal and, as such, it is possible to derive an angle θ from the difference in the resistance (and therefore currents) on each side of the connection as discussed herein.

Exemplary Circuit Diagrams of the Invention

Figure 5:
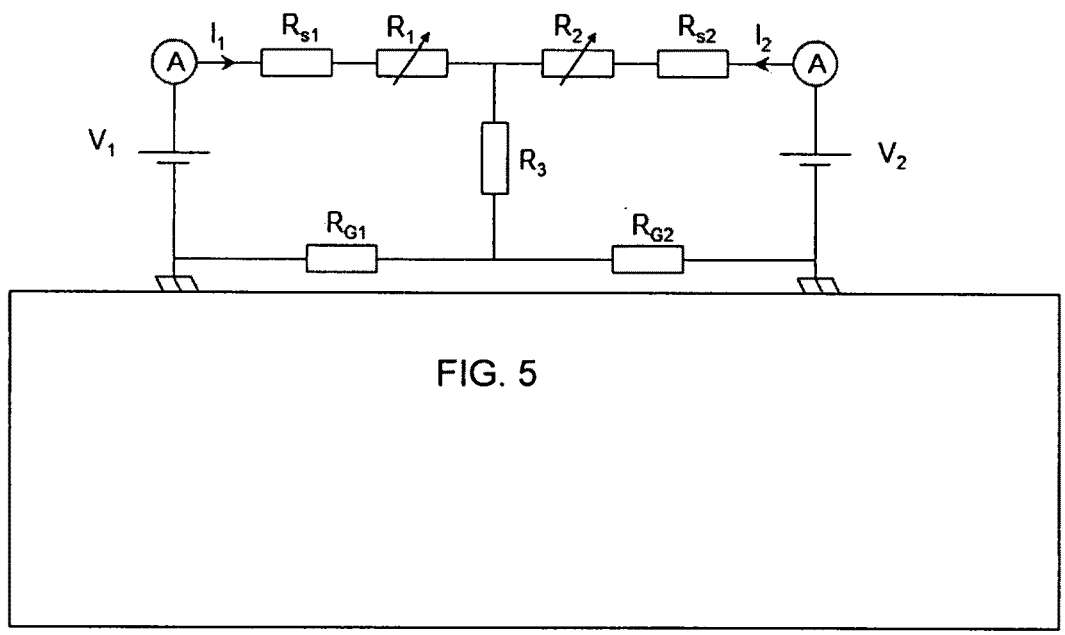
FIGS. 5 and 6 show illustrative circuit diagrams in accordance with the invention.

FIG. 5 shows an illustrative circuit diagram in accordance with the invention. More specifically, the circuit of FIG. 5 is representative of an alignment scheme in accordance with the invention. In FIG. 5, $R_1$, $R_2$ are the resistances on the left and right of the contact 12;

$R_{s1}$, $R_{s2}$ are the static resistances of components to the left and the right of the contact 12 (e.g., wires, ammeter, voltage source);

$R_3$ is the resistance of the conducting contact on the back of the wafer;

$V_1$, $V_2$ are the DC source voltages; and $I_1$, $I_2$ are the currents to the left and the right of the contact point with the wafer.

Figure 6:
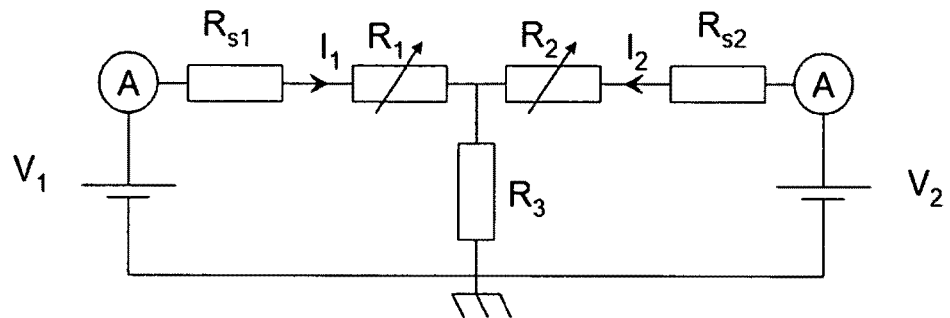

$R_{G1}$ and $R_{G2}$ of circuit of FIG. 5 can be safely ignored due to the fact that their magnitudes are significantly lower than $R_1$ and $R_2$. As such, $R_{G1}$, and $R_{G2}$ would not contribute significantly to the final result (e.g., alignment calculation) as the relevant information is the difference between the two sides of the contact 12. $R_{s1}$ and $R_{s2}$, however, should be included since their difference could be comparable to the difference between $R_1$ and $R_2$. This being the case, the circuit of FIG. 5 can be simplified as shown in the circuit of FIG. 6.

Exemplary Processes of the Invention

The present invention provides processes to calculate alignment of a wafer on a chuck. In providing the processes, the following assumptions are taken into account:

The contact 12 on the chuck is made uniformly, and of the same material;

The conducting contact 18a of the back of the wafer "W" is a uniform material;

The grounding plate 14a has a negligible resistance.

Figure 7:
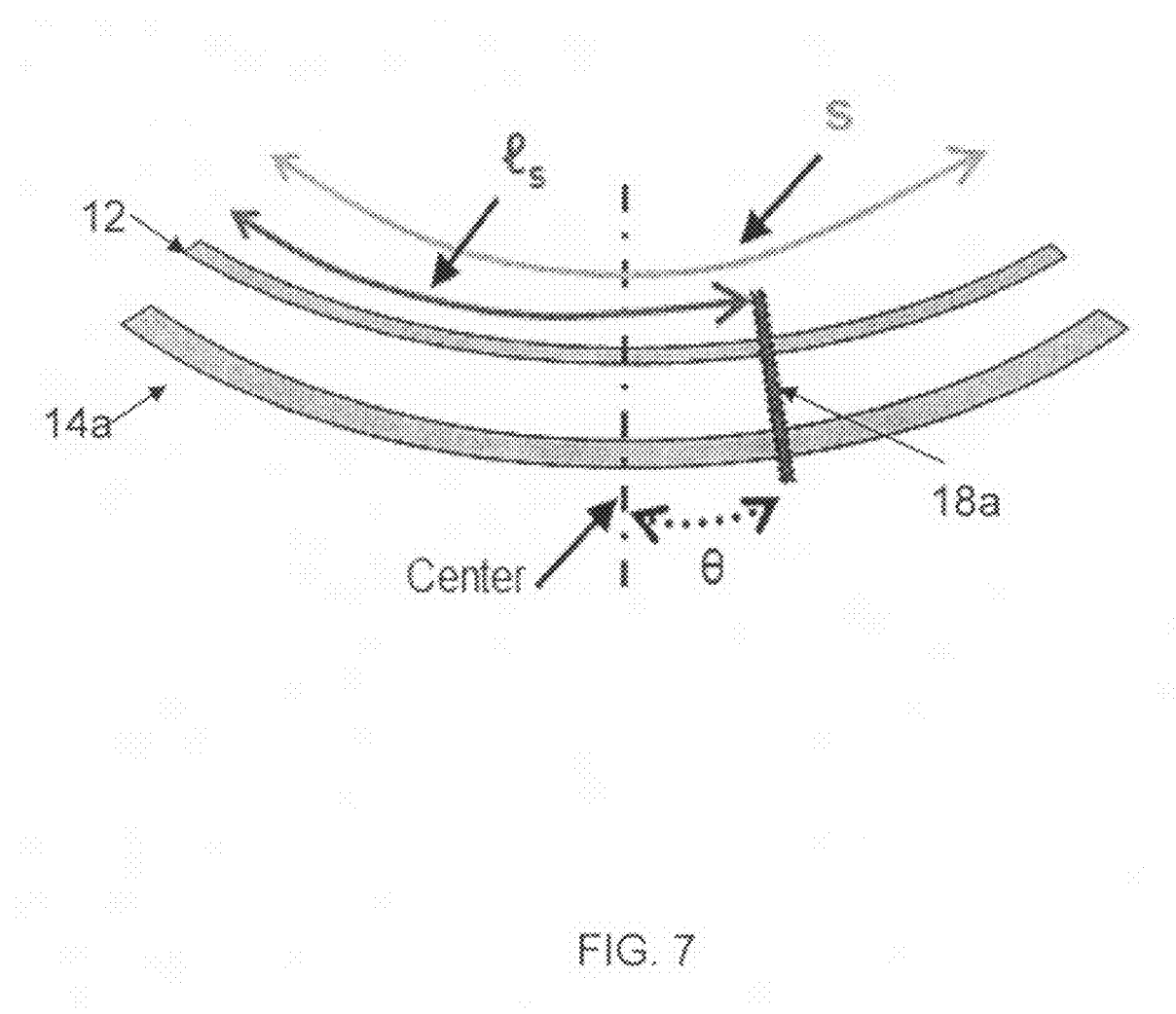
FIG. 7 shows a visualization of variables in accordance with the invention.

In addition, FIG. 7 shows several variables used in the calculations according to the invention. These variables are defined as follows:

$l_s$ is the arc length (arc length) of the contact 12 (from one end of the contact to the connection point);

"s" is the entire length of the contact;

θ is the angle from a center of the contact 12, in radians; and $r_c$ is the radius from the center of the chuck to the contact 12.

In accordance with the invention, electrical resistance of the contact 12 can be calculated using the below equation:

$$R = \frac{\rho \ell}{A} \, [\Omega] \quad (1)$$

where,

R Electrical Resistance [Ω];

ρ=Electrical Resistivity [Ω-m];

l=Length of the wire [m]; and

A=Cross-sectional area of the wire [m²].

Using the circuit of FIG. 6, the resistance $R_3$ is calculated using equation (1), since the resistivity, length, and area are known. Calculating the change in resistance is provided by the equation:

$$\Delta R = (R_1 + R_{s1}) - (R_2 + R_{s2})$$

$$= \left(\frac{\rho \ell_s}{A} + R_{s1}\right) - \left(\frac{\rho(s - \ell_s)}{A} + R_{s2}\right)$$

-continued $$= \frac{\rho(2\ell_2 - s)}{A} + (R_{s1} - R_{s2}) \; [\Omega]$$

Solving the above equation for $l_s$ is provided by the equation:

$$\ell_s = \frac{A(\Delta R)}{2\rho} + \frac{s}{2} \; [m]$$

From the definition of an angle:

$$\text{Angle} = \frac{\text{arclength}}{\text{radius}}$$

$$\theta = \frac{\left(\ell_2 - \frac{s}{2}\right)}{r_c}$$

$$= \frac{\left(\left(\frac{A(\Delta R)}{2\rho} + \frac{s}{2}\right) - \frac{s}{2}\right)}{r_c}$$

$$= \frac{A(\Delta R)}{2\rho r_c} \; [\text{radians}]$$

$\Delta R$ will be a function of the current since current is the only input. As such, $\Delta R$ can be represented by the equation:

$$\Delta R = (R_1 + R_{s1}) - (R_2 + R_{s2}) = \frac{V_1}{I_1} - \frac{V_2}{I_2} \; [\Omega]$$

Knowing $\Delta R$, the angle of the wafer on the chuck can be calculated using the below equation:

$$\theta = \frac{A\left(\frac{V_1}{I_1} - \frac{V_2}{I_2}\right)}{2\rho r_c} \; [\text{radians}]$$

By knowing the angle of the wafer, it is now possible to determine whether the wafer is properly aligned. By example, if the angle $\theta=0$, the wafer is properly aligned. On the other hand, if the angle $\theta$ is not equal to 0, the wafer must be moved by the angle $\theta$ to place it in proper alignment. The same reasoning may be applied for any desired angle $\theta$, in situations such that the optimal alignment is non-zero.

As previously discussed, the wafer can be aligned by independently moving the inner cylinder or plate 16 under control of controller "C". For example, once the angle is determined, the controller "C" will provide a signal to the inner cylinder or plate 16 with instructions to move the wafer a certain amount of degrees. In response, the inner cylinder or plate 16 will lift, rotate, and then lower to place the wafer on the contact 12 at the desired angle. As this can be an iterative process, the angle can again be measured to ensure proper alignment, and if not properly aligned, the controller "C" will provide further instructions to the inner cylinder or plate 16.

Figure 8:
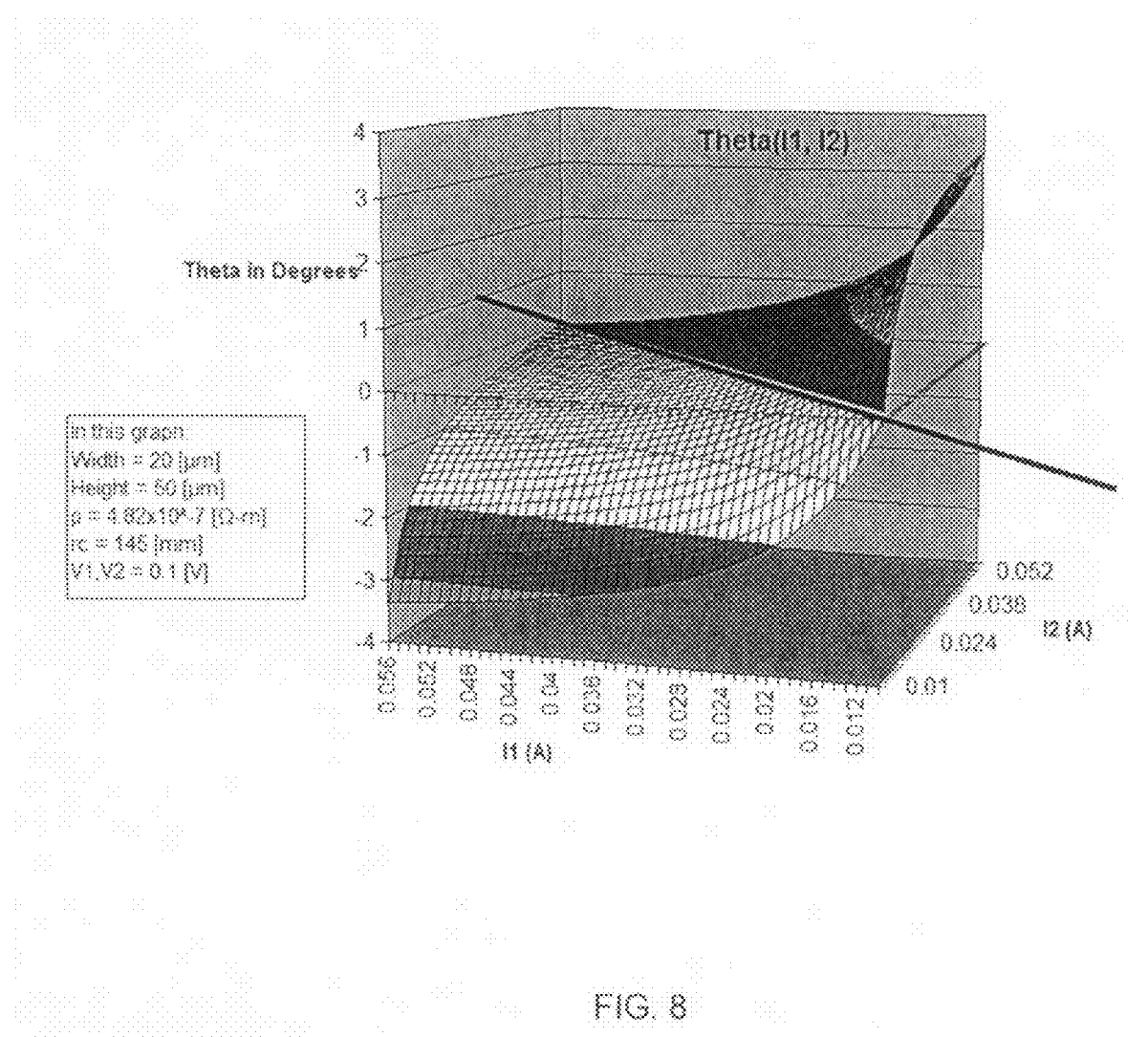
FIGS. 8 and 9 show illustrative plots in accordance with the invention.

FIG. 8 is a plot of the angle $\theta$ in degrees as a direct function of currents $I_1$ and $I_2$. The line through the center represents $I_1=I_2$, where $\theta$ is 0. As should be understood at $\theta=0$, the wafer is in proper alignment. In another example, the leftmost point of the plot, e.g., $I_1$ is about 56 mA and $I_2$ is about 0.01 mA, indicates an angle of about $-3.2°$. As should be further understood from the plot of FIG. 8, when $I_1$ increases $I_2$ decreases and vice versa. Accordingly, such increases and decreases in the current will effectively shift the point of correction until $I_1=I_2$.

In the example of FIG. 8, the following parameters were used to obtain the plot of FIG. 8.:
Width of contact=20 μm
Height of contact=50 μm
$\rho=4.82\times10^{-7}$ Ω-m
$r_c=145$ mm
V1, V2=0.1 V Sensitivity In order to qualitatively calculate the sensitivity of the equation to a simultaneous change to both currents $I_1$ and $I_2$, the magnitude of its gradient is found using the below equation.

$$\nabla(\theta(I_1, I_2)) = \frac{A}{2\rho r_c}\left[\frac{-V_1}{I_1^2}, \frac{V_2}{I_2^2}\right]$$

$$|\nabla(\theta(I_1, I_2))| = \frac{A}{2\rho r_c}\sqrt{\left(\frac{-V_1}{I_1^2}\right)^2 + \left(\frac{V_2}{I_2^2}\right)^2}$$

Figure 9:
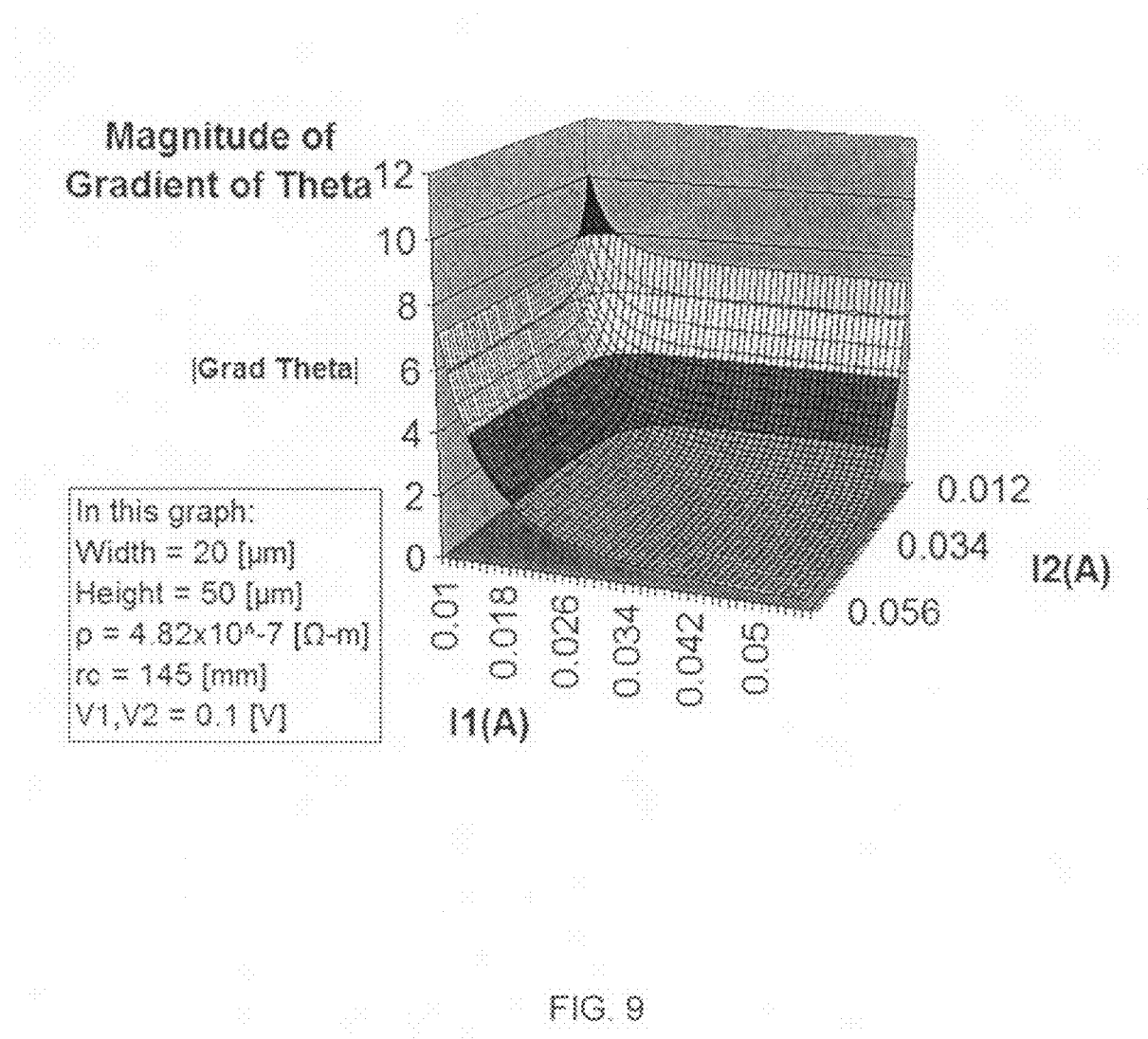

A plot of the magnitude of the gradient of $\theta$ is shown in FIG. 9. The following parameters were used to obtain the plot of FIG. 9:
Width of contact=20 μm
Height of contact=50 μm
$\rho=4.82\times10^{-7}$ Ω-m
$r_c=145$ mm
V1, V2=0.1 V As shown for the given parameter set, when the currents are <26 mA there is a non-linear change in the sensitivity per unit change in current. For this reason, the system parameters should be set such that it is operated in the approximately linear region of >26 mA.

Table 1 shows the sensitivities for a 2 mA change in current from 35 mA (+1 mA to $I_1$, −1 mA to $I_2$). The resistivity listed for each material is valid at 20° C. For higher temperature applications, the resistivity would be altered.

TABLE 1

Table of Sensitivities (1.0 [mA] Sensing)

| | | Material | | |
|---|---|---|---|---|
| | Copper | Aluminum | Platinum | Manganin |
| | | Resistivity [Ω-m] | | |
| | $1.7 \times 10^{-8}$ | $2.82 \times 10^{-8}$ | $1.1 \times 10^{-7}$ | $4.82 \times 10^{-7}$ |
| $V_1, V_2$ [V] 0.05 | 0.922° | 0.556° | 0.143° | 0.0325° |
| 0.1 | 1.844° | 1.112° | 0.285° | 0.065° |
| 0.2 | 3.690° | 2.224° | 0.570° | 0.130° |
| 0.3 | 5.534° | 3.336° | 0.855° | 0.190° |
| 0.4 | 7.379° | 4.448° | 1.140° | 0.260° |

As seen from Table 1, Manganin provides the most sensitive angle measurement of 0.0325° with a resistivity of $4.82\times10^{-7}$ at a voltage of 0.05. Also, as seen from Table 1, a higher change in angle $\theta$ correlates to an increased voltage (and hence the increased current). Also, as the sensitivity is dependent on the current supplied, there is a greater sensitivity at smaller currents. Likewise, as the current increases, there is less sensitivity with a larger angle, θ, range. However, as shown in the plot of FIG. 9, many of these changes are not linear.

Table 2 represents the theoretical sensitivities of the system with increased current sensing ability. As shown, the increased theta sensitivity results in less tolerance to differences in circuit elements and noise. This could potentially introduce an offset into the system, since at such a small scope there is an increased chance that the differences between the right and left sides of the arc will be non-zero.

TABLE 2

Table of Sensitivities (Using 20° C. Manganin, and 0.1 [V])

| | Current Sensitivity | | |
|---|---|---|---|
| | 1 [mA] | 10 [µA] | 1 [µA] |
| Theta Sensitivity | 0.065° | 0.0006284° | 0.0003457° |

System Environment

Figure 10:
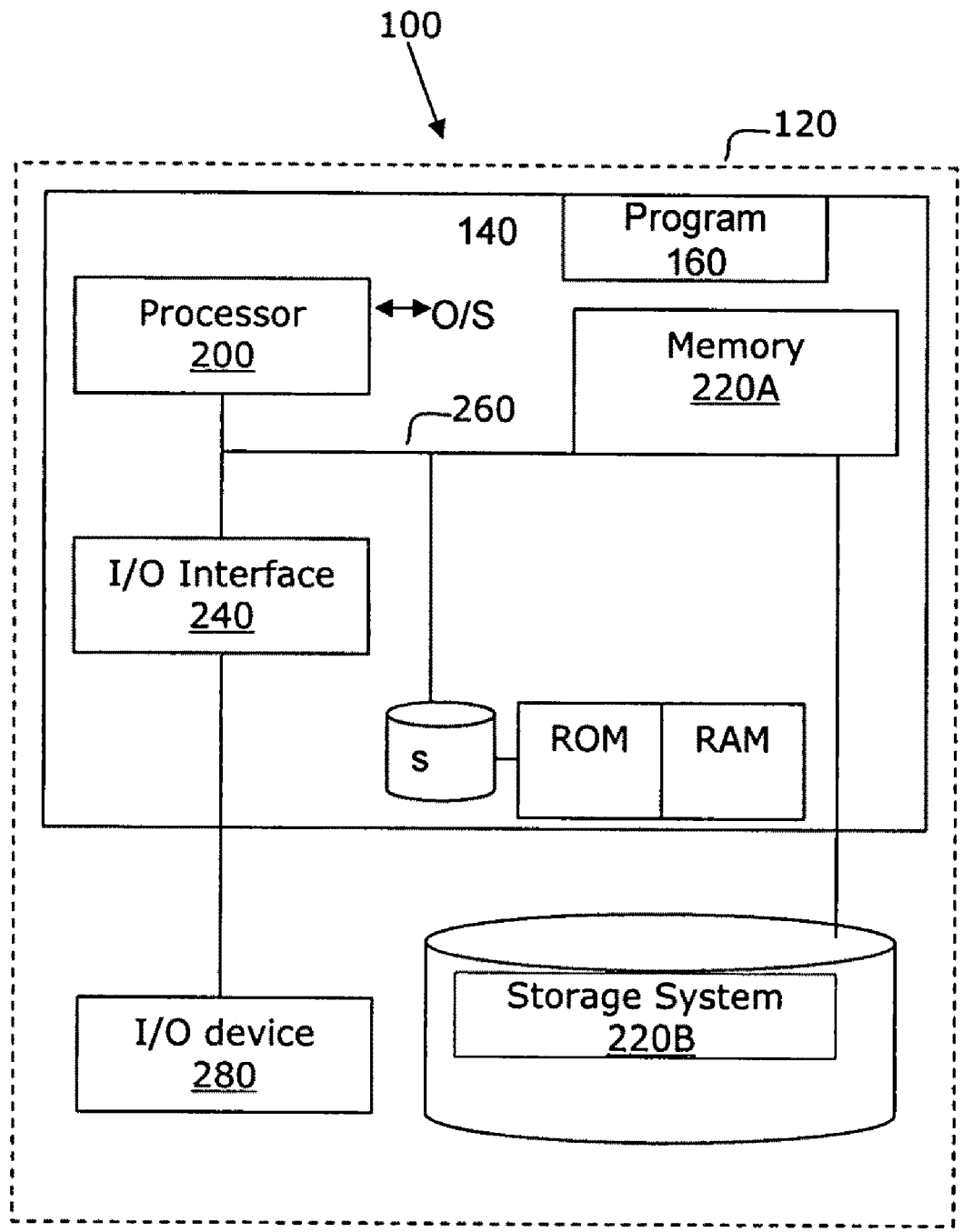
FIG. 10 shows an illustrative environment for implementing the processes in accordance with the invention.

FIG. 10 shows an illustrative environment 100 for managing the processes in accordance with the invention. The illustrative environment may be a server, a user workstation or a personal computer, for example, which is configured to perform the above calculations and provide the control to the inner cylinder or plate 16.

The environment includes a computer infrastructure 120 having a computing device 140, which includes an executable program 160. In embodiments, the executable program 160 performs the calculations and functions described herein. The executable program 160 includes executable code, which may be stored temporarily or permanently in a memory 220A. As should be understood by those of skill in the art, the executable code can be configured to implement the above functions.

The memory 220A can include local memory employed during actual execution of program code, bulk storage, and cache memories which provide temporary storage of at least some program code in order to reduce the number of times code must be retrieved from bulk storage during execution. The computer infrastructure 120 further includes a processor 200, an input/output (I/O) interface 240, a bus 260, Storage "S", ROM, RAM and an external I/O device/resource 280.

The computer infrastructure 120 also includes an operating system O/S, which may be any operating system. The external I/O device/resource 280 may be a keyboard, display, pointing device, or any device that enables the computer infrastructure 120 to communicate with one or more other computing devices using any type of communications link 300. The communications link 300 can be, for example, wired and/or wireless links; one or more types of networks (e.g., the Internet, a wide area network, a local area network, a virtual private network, etc.); and/or any known transmission techniques and protocols such as, for example, TCP/IP.

The processor 200 executes the computer program code and logic of the system and method of the invention, which is stored in the memory 220A. While executing the computer program code, etc., the processor 200 can read and/or write data to/from the memory 220A, storage system 220B, and/or I/O interface 240. The bus 260 provides a communications link between each of the components in the computing device 140.

Exemplary Uses

The method as described above is used in the fabrication of integrated circuit chips. The system and method is a viable alternative to current optical wafer alignment techniques, as the system and method provides a more precise and customizable method of solving the current alignment problem through an electronic approach. The alignment precision of the disclosed system and method is suitable for a coarse and/or fine alignment, depending on the choice of materials, as discussed above. For example, Manganin can be used to provide fine alignment; whereas, copper can be used to provide course adjustments. (See, Table 1.)

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed is:

1. A computer program product comprising a computer usable medium having readable program code embodied in the medium, the computer program product includes at least one component to perform the processes of calculating an angle of displacement of a wafer based on measured resistance of opposing branches of a contact from a point of electrical contact with the wafer, wherein the at least one component to further perform the processes of calculating a centering of the wafer on a tool based on a triangulation of contacts on a backside of the wafer and at least two contacts on a chuck holding the wafer.

2. A method, comprising:
   measuring current on each branch of a circuit;
   calculating an angle of a wafer based on a difference in the current on each branch of the circuit;
   calculating a centering alignment of the wafer on a chuck using triangulation data obtained from contacts on a backside of the wafer and contacts on the chuck; and
   lifting, rotating and lowering the wafer using an inner cylinder or plate in order to correct alignment of the wafer based on the calculations, wherein
   the angle of the wafer is calculated by:

$$\theta = \frac{A\left(\frac{V_1}{I_1} - \frac{V_2}{I_2}\right)}{2\rho r_c} \text{ [radians]}$$

and coarse and fine wafer alignment is provided using at least one single conductive arc layout for the contacts on the chuck.

* * * * *